United States Patent
Nguyen et al.

(10) Patent No.: US 12,114,451 B2
(45) Date of Patent: Oct. 8, 2024

(54) ELECTRONIC DEVICES WITH FOLDING DISPLAYS HAVING FLEXIBLE AREA SUPPORT STRUCTURES

(71) Applicant: Apple Inc., Cupertino, CA (US)

(72) Inventors: Que Anh S. Nguyen, San Jose, CA (US); Matthew S. Rogers, San Jose, CA (US)

(73) Assignee: Apple Inc., Cupertino, CA (US)

( * ) Notice: Subject to any disclaimer, the term of this patent is extended or adjusted under 35 U.S.C. 154(b) by 281 days.

(21) Appl. No.: 17/538,701

(22) Filed: Nov. 30, 2021

(65) Prior Publication Data

US 2022/0201885 A1 Jun. 23, 2022

Related U.S. Application Data

(60) Provisional application No. 63/166,555, filed on Mar. 26, 2021, provisional application No. 63/127,690, filed on Dec. 18, 2020.

(51) Int. Cl.
*H05K 5/03* (2006.01)
*G06F 1/16* (2006.01)
*H05K 5/00* (2006.01)

(52) U.S. Cl.
CPC .............. *H05K 5/03* (2013.01); *G06F 1/1652* (2013.01); *H05K 5/0017* (2013.01)

(58) Field of Classification Search
CPC .................................. H05K 5/03; G06F 1/1652
See application file for complete search history.

(56) References Cited

U.S. PATENT DOCUMENTS

| | | | |
|---|---|---|---|
| 9,189,027 B2 | 11/2015 | Lee et al. | |
| 9,516,743 B2 | 12/2016 | Kim et al. | |
| 9,604,391 B2 | 3/2017 | Tamada et al. | |
| 9,811,120 B2 | 11/2017 | Namkung et al. | |
| 9,848,494 B2 | 12/2017 | Huitema et al. | |
| 9,935,279 B2 | 4/2018 | Lee et al. | |
| 10,020,462 B1 * | 7/2018 | Ai | H10K 59/871 |
| 10,104,787 B2 | 10/2018 | Rothkopf et al. | |
| 10,303,218 B2 | 5/2019 | Jones et al. | |
| 10,462,896 B1 | 10/2019 | Kwon et al. | |

(Continued)

FOREIGN PATENT DOCUMENTS

| | | |
|---|---|---|
| CN | 106328003 A | 1/2017 |
| CN | 109263185 A | 1/2019 |

*Primary Examiner* — David Sample
*Assistant Examiner* — Donald M Flores, Jr.
(74) *Attorney, Agent, or Firm* — Treyz Law Group, P.C.; G. Victor Treyz; David K. Cole

(57) ABSTRACT

A foldable display may have a display cover layer and display panel that bend around a bend axis. The display panel may have an array of pixels configured to display an image through the display cover layer. The display cover layer may be formed from a layer of glass. A recess may be formed in the layer of glass that extends along and overlaps the bend axis. The recess forms a flexible locally thinned portion in the glass that allows the display cover layer to bend. Polymer may be formed in the recess. Stiffening structures such as glass strips and glass beads of one or more diameters may be embedded in the polymer to help resist inward compression of the surface of the display cover layer in the locally thinned region while allowing the display cover layer to bend about the bend axis.

24 Claims, 8 Drawing Sheets

(56) References Cited

U.S. PATENT DOCUMENTS

| | | |
|---|---|---|
| 10,476,037 B2 | 11/2019 | Mun et al. |
| 10,481,423 B2 | 11/2019 | Song et al. |
| 10,579,105 B2 | 3/2020 | Jones et al. |
| 2006/0146488 A1 | 7/2006 | Kimmel |
| 2013/0083496 A1 | 4/2013 | Franklin et al. |
| 2019/0265756 A1* | 8/2019 | Jones .................... G09F 9/301 |
| 2020/0001577 A1 | 1/2020 | Woody et al. |
| 2020/0139672 A1 | 5/2020 | Cao |
| 2020/0171781 A1* | 6/2020 | Zhang ................ B32B 17/1055 |
| 2020/0313111 A1 | 10/2020 | Kim et al. |

\* cited by examiner

ELECTRONIC DEVICES WITH FOLDING DISPLAYS HAVING FLEXIBLE AREA SUPPORT STRUCTURES

This application claims the benefit of provisional patent application No. 63/127,690, filed Dec. 18, 2020, and provisional patent application No. 63/166,555, filed Mar. 26, 2021, which are hereby incorporated by reference herein in their entireties.

FIELD

This relates generally to electronic devices, and, more particularly, to electronic devices with displays.

BACKGROUND

Electronic devices often have displays. Portability may be a concern for some devices, which tends to limit available real estate for displays.

SUMMARY

An electronic device may be provided with a foldable housing that allows the device to fold and unfold about a bend axis. A flexible display may be mounted in the foldable housing. The flexible display may have an array of pixels forming a display panel. The display panel may be configured to bend along the bend axis as the device is folded.

The flexible display may have a display cover layer that overlaps the display panel. The display cover layer may be formed from a layer of glass. A groove-shaped recess may be formed in the layer of glass that runs parallel to the bend axis. The recess forms a flexible locally thinned portion in the glass over the bend axis that allows the display to bend about the bend axis.

Polymer may be placed in the recess to help planarize the inner surface of the display cover layer. Stiffening structures such as glass strips and/or glass beads of one or more diameters may be embedded in the polymer to help stiffen the surface of the display cover layer in the locally thinned region so that the outer surface of the display cover layer is not too easily deformed by external pressure from an object such as a stylus. While supporting the outer surface of the display cover layer, the stiffening structures allow the display cover layer to bend satisfactorily about the bend axis.

DETAILED DESCRIPTION

Electronic devices may be provided with displays. Displays may be used for displaying images for users. Displays may be formed from arrays of light-emitting diode pixels or other pixels. For example, a device may have an organic light-emitting diode display or a display formed from an array of micro-light-emitting diodes (e.g., diodes formed from crystalline semiconductor dies).

Figure 1:
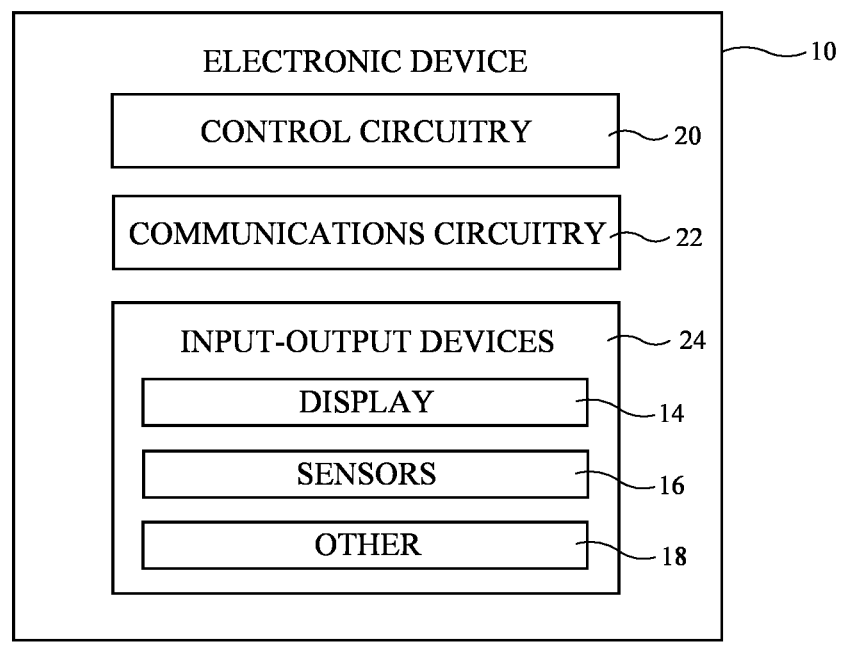
FIG. 1 is a schematic diagram of an illustrative electronic device in accordance with an embodiment.

A schematic diagram of an illustrative electronic device having a display is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment. Configurations in which device 10 is a cellular telephone, tablet computer, or other portable electronic device may sometimes be described herein as an example. This is illustrative. Device 10 may, in general, be any suitable electronic device with a display.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 20 may use a display and other output devices in providing a user with visual output and other output.

To support communications between device 10 and external equipment, control circuitry 20 may communicate using communications circuitry 22. Circuitry 22 may include antennas, radio-frequency transceiver circuitry (wireless transceiver circuitry), and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 6 GHz and 300 GHz, a 60 GHz link, or other millimeter wave link, cellular telephone link, wireless local area network link, personal area network communications link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Configurations in which display 14 is an organic light-emitting diode display or microLED display are sometimes described herein as an example.

Display 14 may have an array of pixels configured to display images for a user. The pixels may be formed as part of a display panel that is bendable. This allows device 10 to be folded and unfolded about a bend axis. For example, a flexible (bendable) display in device 10 may be folded so that device 10 may be placed in a compact shape for storage and may be unfolded when it is desired to view images on the display.

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
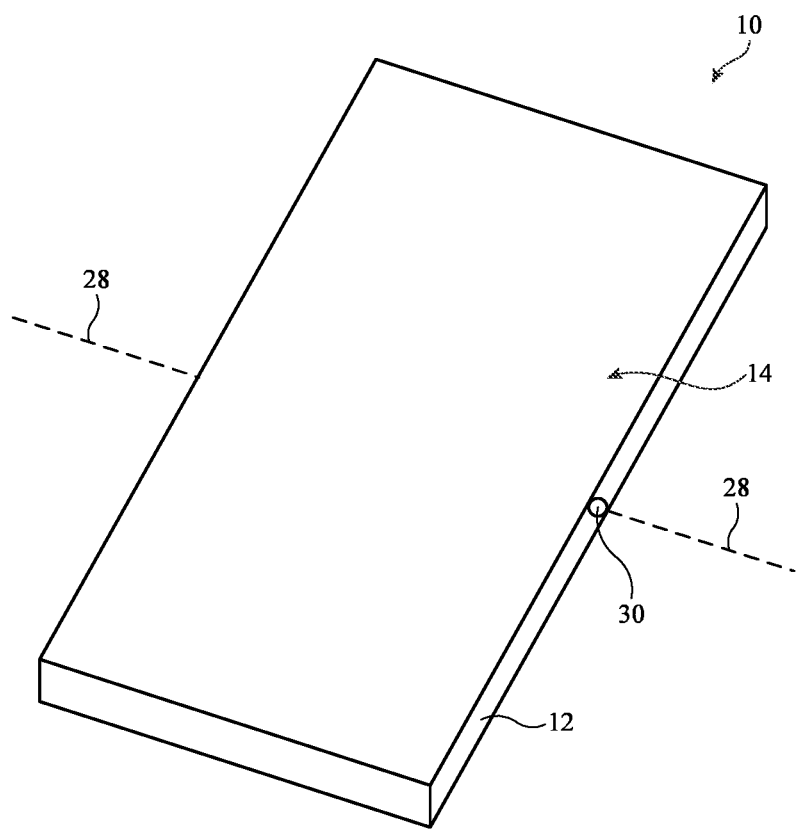
FIG. 2 is a perspective view of an illustrative electronic device with a display in accordance with an embodiment.

FIG. 2 is a perspective view of electronic device 10 in an illustrative configuration in which device 10 is a portable electronic device such as a cellular telephone or tablet computer. As shown in FIG. 2, device 10 may have a display such as display 14. Display 14 may cover some or all of the front face of device 10. Touch sensor circuitry such as two-dimensional capacitive touch sensor circuitry may be incorporated into display 14.

Display 14 may be mounted in housing 12. Housing 12 may form front and rear housing walls, sidewall structures, and/or internal supporting structures (e.g., a frame, an optional midplate member, etc.) for device 10. Glass structures, transparent polymer structures, and/or other transparent structures that cover display 14 and other portions of device 10 may provide structural support for device 10 and may sometimes be referred to as housing structures. For example, a transparent housing portion such as a glass or polymer housing structure that covers and protects a pixel array in display 14 may serve as a display cover layer for the pixel array while also serving as a housing wall on the front face of device 10. In configurations in which a display cover layer is formed from glass, the display cover layer may sometime be referred to as a display cover glass or display cover glass layer. The portions of housing 12 on the sidewalls and rear wall of device 10 may be formed from glass or other transparent structures and/or opaque structures. Sidewalls and rear wall structures may be formed as extensions to the front portion of housing 12 (e.g., as integral portions of the display cover layer) and/or may include separate housing wall structures.

Housing 12 may have flexible structures (e.g., bendable housing wall structures) and/or hinge structures such as hinge 30. Hinge 30 may have a hinge axis aligned with device bend axis 28. Hinge 30 and/or flexible housing structures that overlap bend axis 28 may allow housing 12 to bend about bend axis 28. For example, housing 12 may have a first portion on one side of bend axis 28 and a second portion on an opposing side of bend axis 28 and these two housing portions may be coupled by hinge 30 for rotational motion about axis 28.

As housing 12 is bent about bend axis 28, the flexibility of display 14 allows display 14 to bend about axis 28. In an illustrative configuration, housing 12 and display 14 may bend by 180°. This allows display 14 to be folded back on itself (with first and second outwardly-facing portions of display 14 facing each other). The ability to place device 10 in a folded configuration in this way may help make device 10 compact so that device 10 can be stored efficiently. When it is desired to view images on display 14, device 10 may be unfolded about axis 28 to place device 10 in the unfolded configuration of FIG. 2. This allows display 14 to lie flat and allows a user to view flat images on display 14. The ability to fold display 14 onto itself allows device 10 to exhibit an inwardly folding behavior. Display 14 may be sufficiently flexible to allow device 10 to be folded outwardly and/or inwardly.

Device 10 of FIG. 2 has a rectangular outline (rectangular periphery) with four corners. As shown in FIG. 2, a first pair of parallel edges (e.g., the left and right edges of device 10 in the example of FIG. 2) may be longer than a second pair of parallel edges (e.g., the upper and lower edges of device 10 of FIG. 2) that are oriented at right angles to the first pair of parallel edges. In this type of configuration, housing 12 is elongated along a longitudinal axis that is perpendicular to bend axis 28. Housing 12 may have other shapes, if desired (e.g., shapes in which housing 12 has a longitudinal axis that extends parallel to bend axis 28). With an arrangement of the type shown in FIG. 2, the length of device 10 along its longitudinal axis may be reduced by folding device 10 about axis 28.

Figure 3:
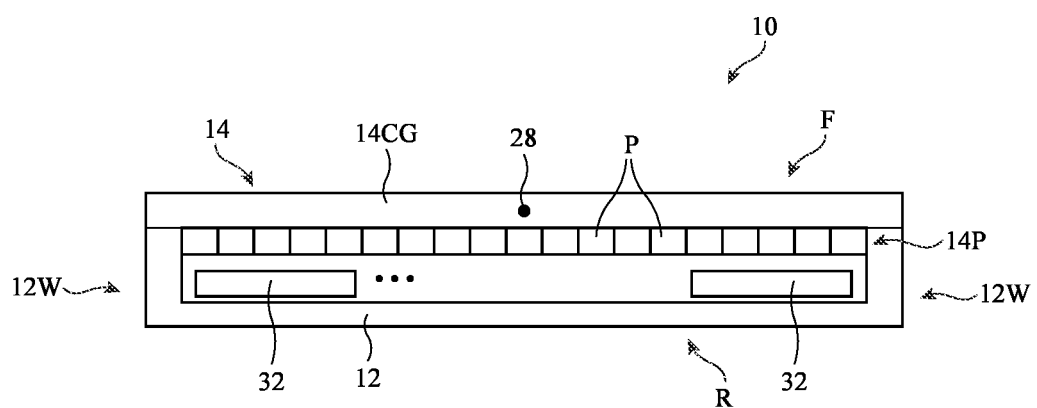
FIG. 3 is a cross-sectional side view of an illustrative electronic device in accordance with an embodiment.

FIG. 3 is a cross-sectional side view of an illustrative foldable electronic device. Device 10 of FIG. 3 may bend about bend axis 28. Bend axis 28 may be aligned with display cover layer 14CG or other structures in device 10. For example, bend axis 28 may pass through a portion of display cover layer 14CG or may be located above or below layer 14CG.

As shown in FIG. 3, display 14 includes an array of pixels P forming display panel 14P under an inwardly facing surface of display cover layer 14CG. Display panel 14P may be, for example, a flexible organic light-emitting diode display or a microLED display in which light-emitting pixels are formed on a flexible substrate layer (e.g., a flexible layer of polyimide or a sheet of other flexible polymer). Flexible support layer(s) for display 14 may also be formed from flexible glass, flexible metal, and/or other flexible structures.

Display cover layer 14CG may be formed from polymer, glass, crystalline materials such as sapphire, other materials, and/or combinations of these materials. To enhance flexibility, a portion of layer 14CG that overlaps and extends along bend axis 28 may be locally thinned (e.g., this portion may be thinned relative to portions of layer 14CG that do not overlap bend axis 28). The thickness of layer 14CG (e.g., the non-thinned portions of layer 14CG) may be 50-200 microns, 70-150 microns, 100-200 microns, 100-600 microns, at least 100 microns, at least 200 microns, less than 600 microns, less than 400 microns, less than 250 microns, less than 150 microns, less than 100 microns, at least 50 microns, or other suitable thickness.

In the example of FIG. 3, housing 12 has a portion on rear face R that forms a rear housing wall and has side portions forming sidewalls 12W. The rear housing wall of housing 12 may form a support layer for components in device 10. Housing 12 may also have one or more interior supporting layers (e.g., frame structures such as an optional midplate, etc.). These interior supporting layers and the rear housing wall may have first and second portions that are coupled to opposing sides of a hinge that is aligned with bend axis 28 (see, e.g., hinge 30 of FIG. 2) or may be sufficiently flexible to bend around bend axis 28.

Electrical components 32 may be mounted in the interior of device 10 (e.g., between display 14 and the rear of housing 12. Components 32 may include circuitry of the type shown in FIG. 1 (e.g., control circuitry 20, communications circuitry 22, input-output devices 24, batteries, etc.). Display 14 may be mounted on front face F of device 10. When device 10 is folded about axis 28, display cover layer 14CG, display panel 14P, and the other structures of device 10 that overlap bend axis 28 may flex and bend to accommodate folding.

Figure 4:
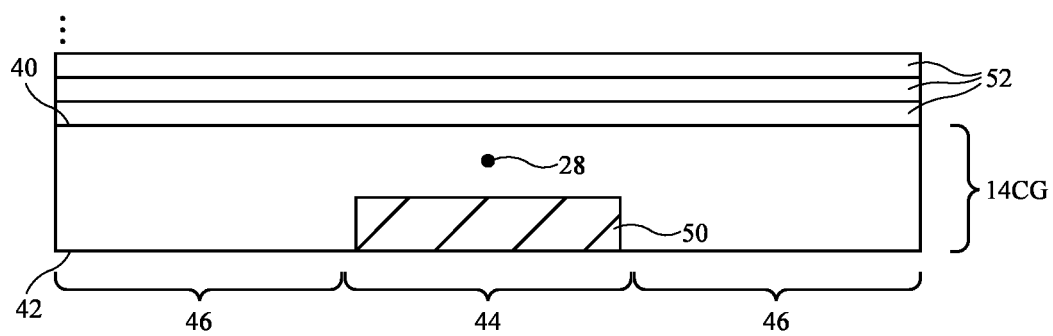
FIG. 4 is a cross-sectional side view of an illustrative display having a cover layer with a locally thinned hinge region in accordance with an embodiment.

The outer and/or inner surfaces of display cover layer 14GC may be provided with coatings. These coatings may include, for example, antireflection coatings, anti-scratch coatings, anti-smudge coatings, and/or other coating layers. Consider, as an example, the cross-sectional side view of display cover layer 14CG of FIG. 4. As shown in FIG. 4, display cover layer may have an outer surface (outwardly facing surface) such as surface 40 and an opposing inner surface (inwardly facing surface) such as surface 42. A strip-shaped region of display cover layer 14CG that overlaps and runs parallel to bend axis 28 may be locally thinned (e.g., a groove or other recess that runs parallel to bend axis 28 may be formed in layer 14CG to form locally thinned portion 44 of layer 14CG). Locally thinned portion 44 of layer 14CG may be thinner than other portions of layer 14CG such as non-thinned portions 46 (which may be, for example, planar glass layer portions of layer 14CG). The presence of portion 44 in display cover layer 14CG may facilitate bending of display cover layer 14CG about bend axis 28.

To help planarize inner surface 42 and thereby facilitate mounting of display panel 14P against inner surface 42 (e.g., with a layer of adhesive), the elongated recess (groove) in the inner surface of layer 14CG that forms thinned portion 44 may be filled with polymer 50. Polymer 50 may be sufficiently flexible to bend about bend axis 28 when device 10 is opened and closed. The refractive index of polymer 50 may be matched to that of display cover layer 14CG to help minimize light reflections (e.g., by incorporating inorganic nanoparticles in polymer 50). For example, at a wavelength of 500 nm, the refractive index of polymer 50 may differ from that of layer 14CG by less than 0.15, less than 0.1, or less than 0.05 (as examples).

Coating layers 52 may be formed on outer surface 40. Coating layers 52 may include, for example, anti-scratch layers (sometimes referred to as hard coats), protective polymer layers, anti-smudge layers, anti-fog layers, antireflection layers, anti-static layers, adhesion layers, and/or other coatings. In some configurations, each of these functions may be implemented using a separate respective coating layer. In other configurations, a single layer may serve multiple functions. In general, coatings such as coatings 52 may be formed on outer surface 40 and/or inner surface 42. In the illustrative configuration of FIG. 4, coatings 52 are formed on outer surface 40.

Coatings 52 may be provided in any suitable order. As one example, the lowermost coating of coatings 52 (e.g., a coating layer formed directly on surface 40 of FIG. 4) may be a hard coat or other anti-scratch layer that helps prevent scratches that could damage layer 14CG. An antireflection coating may be formed on top of the anti-scratch layer. The antireflection layer may be a thin-film interference filter antireflection coating containing a stack of thin-film layers such as dielectric sublayers of alternating refractive index.

One of the thin-film layers may be a conductive layer such as a transparent semiconductor layer (e.g., an indium tin oxide layer) that serves as an antistatic layer. An anti-smudge coating or anti-fog coating may be formed on top of the antireflection layer. Anti-smudge coatings (e.g., hydrophobic polymer coatings) may help reduce fingerprints and other undesired marks on the surfaces of display 14. An example of an anti-smudge coating is a fluoropolymer coating (e.g., a fluoropolymer formed from evaporated perfluoropolyether) that serves as an oleophobic layer. Fluoropolymers can be adhered to underlying coating layers using an intervening adhesion layer.

Figure 5:
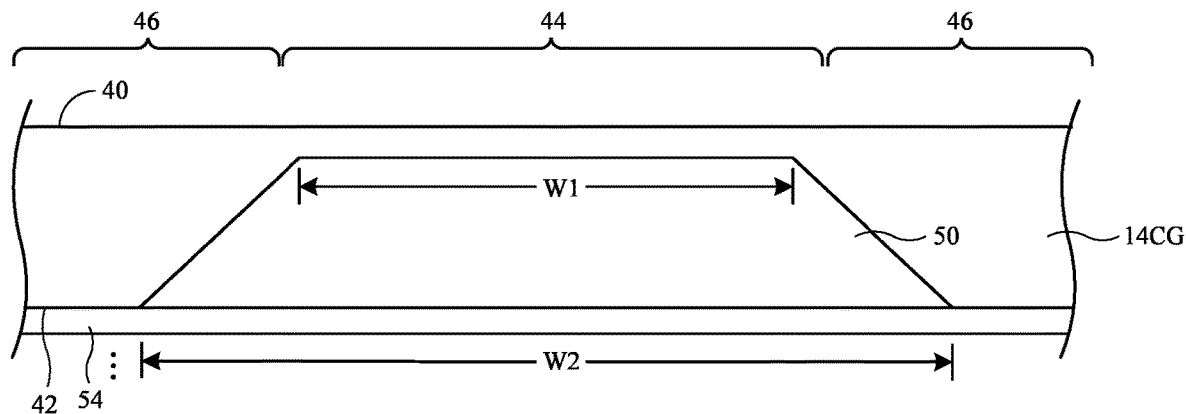
FIG. 5 is a cross-sectional side view of an illustrative locally thinned display cover layer having outer and inner coatings in accordance with an embodiment.

As shown in FIG. 5, the recess in display cover layer 14CG that forms locally thinned portion 44 may have a tapered cross-sectional shape. As shown in FIG. 5, for example, the top portion of the recess may be characterized by a width W1 that is narrower than the width W2 of the lower portion of the recess. This type of arrangement may help avoid abrupt transitions in cover glass thickness and may therefore help reduce stress concentrations while visually obscuring the presence of the recess. To help protect display cover layer 14CG (e.g., to avoid handling-induced defects), one or more coating layers may be formed on inner surface 42. As shown in FIG. 5, for example, protective coating layer 54 (e.g., a polymer layer) may be formed on inner surface 42. Layer 54 may have any suitable thickness (e.g., at least 0.05 microns, at least 0.1 microns, at least 0.4 microns, at least 2 microns, at least 5 microns, less than 50 microns, less than 20 microns, less than 7 microns, less than 3 microns, or other suitable thickness). If desired, a protective polymer layer such as layer 54 may be formed on outer surface 40 (e.g., one of layers 52 of FIG. 4 may be a protective polymer layer such as layer 54).

Protective layer 54 may be formed on inner surface 42 by depositing polymer 50 and layer 54 separately (using the same polymer material for both polymer 50 and layer 54 or using different polymers for polymer 50 and layer 54). As an example, polymer 50 may be deposited in the recess forming thinned portion 44 and cured before depositing and curing a protective polymer layer over polymer 50 and non-thinned areas of inner surface 42.

Figure 6:
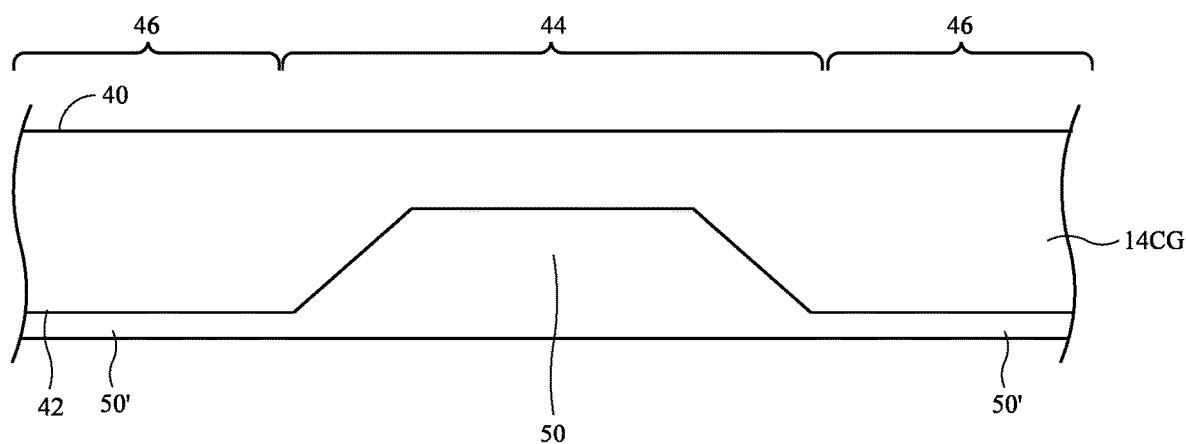
FIG. 6 is a cross-sectional side view of an illustrative locally thinned display cover layer with an inner coating that is formed as an integral portion of a recess-filling layer in accordance with an embodiment.

In another illustrative arrangement, the protective layer on inner surface 42 may be formed as an integral portion of the polymer filling the recess in layer 14CG. As shown in FIG. 6, for example, the same polymer may be used in filling the recess under thinned portion 44 (polymer 50) and in forming the protective coating on surface 42 (polymer 50'). Polymer 50 and 50' in this type of arrangement may be deposited by coating a liquid polymer material onto inner surface 42 followed by application of heat, light (e.g., ultraviolet light), and/or catalyst to promote polymer curing.

During use of device 10, a computer stylus, fingertip, or other external object may press against outer surface 40 of display cover layer 14CG (e.g., to supply touch input to a touch sensor that lies between display panel 14P and the opposing inner surface of display cover layer 14CG or to supply touch input to a touch sensor that is formed as part of display panel 14P). Thinned portion 44 of display cover layer 14CG is preferably sufficiently flexible to allow display cover layer 14CG to be bent about bend axis 28. At the same time, it may be desirable to prevent the region of surface 40 that overlaps bend axis 28 from being too easily depressed inwardly, as this may create an undesirable detectable difference in the stiffness of outer surface 40 as an external object moves across bend axis 28. To help prevent excessive inward compression of surface 40 in the area of display cover layer 14CG that overlaps thinned portion 44, stiffening structures that are separate from display cover layer 14CG may be incorporated into polymer 50 in the recess under thinned portion 44. These stiffening structures may be particles or may be elongated members (e.g., elongated strips of material, rods, etc.). The material that forms the stiffening structures may be glass, polymer, ceramic, crystalline material such as sapphire, and/or other rigid material (e.g., one or more materials that are have a higher modulus of elasticity (and are therefore stiffer) than polymer 50. By incorporating structures that are more rigid than polymer 50 into polymer 50, the stiffness of the thinned portion of layer 14CG (e.g., resistance to localized inward compression) may be locally enhanced, while continuing to allow display 14 to bend freely about axis 28.

Figure 7:
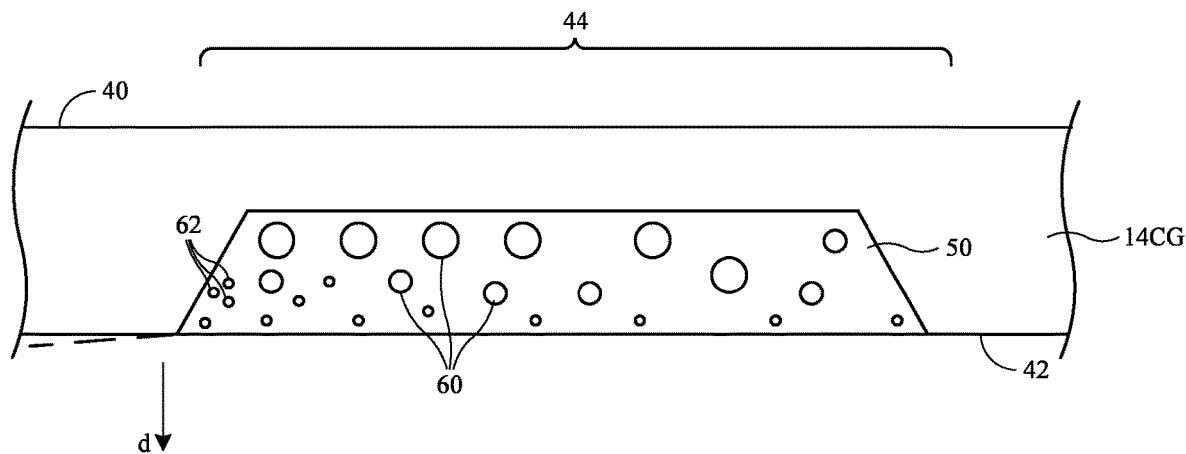
FIG. 7 is a cross-sectional side view of an illustrative locally thinned display cover layer with a polymer filler having embedded particles in accordance with an embodiment.

Consider, as an example, the arrangement of FIG. 7. As shown in FIG. 7, stiffening structures such as stiffening particles 60 may be incorporated into polymer 50 within the recess under thinned portion 44 of display cover layer 14CG. Particles 60 may be spheres or particles of other shapes and may be formed from a material such as glass with a modulus of elasticity that is greater than that of polymer 50 (e.g., particles 60 may be glass beads). This stiffens polymer 50 and help prevent the portion of surface 40 that lies above thinned portion 44 from being too easily depressed (e.g., too easily locally deformed inward) due to pressure on surface 40 from the tip of a stylus or other external object. At the same time, because particles 60 are not directly connected to each other by any rigid structures (e.g., because there is a portion of polymer 50 between adjacent particles), particles 60 are free to move relative to each other while polymer 50 is flexed. As a result, layer 14CG and polymer 50 may still bend freely about bend axis 28.

Particles 60 may be any suitable size. Particles may, as an example, have diameters (e.g., a mean diameter) of at least 0.1 microns, at least 0.2 microns, at least 0.3 microns, at least 0.5 microns, at least 1 microns, at least 2 microns, at least 5 microns, at least 25 microns, 0.2-10 microns, 1-20 microns, 1-50 microns, 0.5-50 microns, less than 100 microns, less than 50 microns, less than 25 microns, less than 12 microns, less than 6 microns, or less than 2.5 microns (as examples).

To help match the refractive index of polymer 50 to that of display cover layer 14CG, it may be desirable to include index-matching particles 62 in polymer 50 in addition to including optional stiffening structures such as stiffening particles 60 or other stiffening structures. Index-matching particles 62 may, as example, be formed from particles of inorganic dielectric (e.g., silica, metal oxides such as zirconia particles, alumina particles, titanic particles, etc.). Such index-matching particles may have nanometer-scale sizes and may sometimes be referred to as index-matching nanoparticles. Index-matching particles 62 may, as an example, have subwavelength sizes (e.g., diameters of about 10 nm, 1-100 nm, at least 2 nm, less than 300 nm, less than 250 nm, less than 200 nm, less than 150 nm, less than 100 nm, less than 50 nm, less than 40 nm, 1-50 nm, 2-40 nm etc.). The concentration of index-matching particles 62 may be increased to increase the effective refractive index of polymer 50 and may be decreased to decrease the effective refractive index of polymer 50. In this way, the refractive index of polymer 50 may be matched to that of display cover layer 14CG and to that of particles 60 or other stiffening structures (e.g., to reduce reflections at the interfaces between polymer 50 and these structures).

Figure 8:
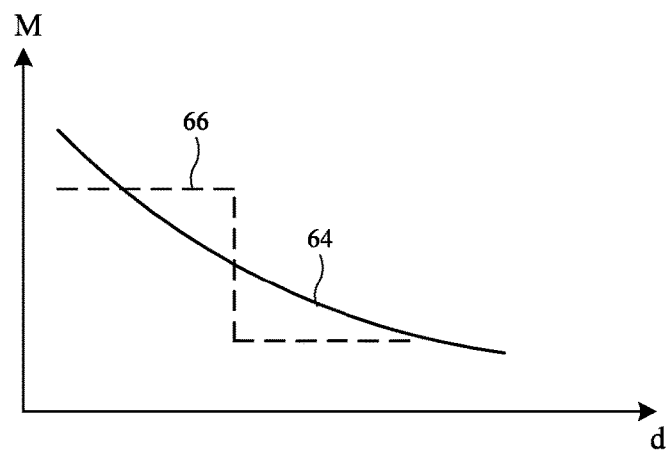
FIG. 8 is a graph in which mean particle diameter in an illustrative recess-filling polymer layer has been plotted as a function of distance through the layer in accordance with an embodiment.

The diameter of particles 60 may be uniform or particles 60 may include spheres or other particles of different sizes. If desired, the diameter (e.g., mean diameter) of particles 60 may be constant throughout polymer 50. In arrangements in which the size of particles 60 varies, the diameters of particles 60 may vary as a function of position in polymer 50. As an example, the diameter (e.g., the mean diameter) of particles 60 may decrease or otherwise vary as a function of distance d from surface 40. In general, any one or more characteristics of particles 60 may vary as a function of distance d. As shown in the graph of FIG. 8, one or more characteristics of particles 60 such as characteristic M may vary continuously (see, e.g., smoothly and continuously decreasing curve 64 of FIG. 8) and/or may vary in a stepwise fashion (see, e.g., stepwise decreasing curve 66 of FIG. 8). Characteristic M may be any suitable particle characteristic(s) such as particle diameter, particle material, particle refractive index, particle shape, the concentration of particles in polymer 50 (e.g., the number of particles per unit volume), and/or other particle characteristic(s).

In arrangements in which the diameter of particles 60 decreases as a function of increasing distance through polymer 50 away from surface 42 at the top of the recess in cover layer 14CG (and therefore as a function of increasing distance from outer surface 40), there will be larger particles near the top of the recess (e.g., nearer to outer surface 40) that help to stiffen surface 40 and smaller particles near the bottom of the recess (e.g., nearer to the rear of layer 14CG). The presence of the smaller particles near the bottom of the recess may help make the lower portion of polymer 50 more flexible than the upper portion of polymer 50. Because the bottom portion of polymer 50 tends to stretch more than the upper portion of polymer 50 as display cover layer 14CG is bent about bend axis 28 (e.g., when the two halves of display 14 are being folded toward themselves), the use of a graded particle size (e.g., a stiffening scheme in which the mean diameter of particles 60 decreases as a function of increasing distance d) may help provide a desired amount of surface stiffening to the region of surface 40 that overlaps polymer 50 while retaining a desired flexibility in display cover layer 14CG so that device 10 and display 14 can be folded. Any suitable technique may be used for forming polymer 50 with embedded stiffening structures such as particles 60 having a gradient in size. With an illustrative configuration, a mixture of liquid polymer material containing particles 60 of varying sizes is used to cover thinned region 44 while display cover layer 14CG is resting with its inner surface facing upwards. In this type of configuration, the force of gravity will tend to separate particles by size, after which the polymer material can be cured.

Figure 9:
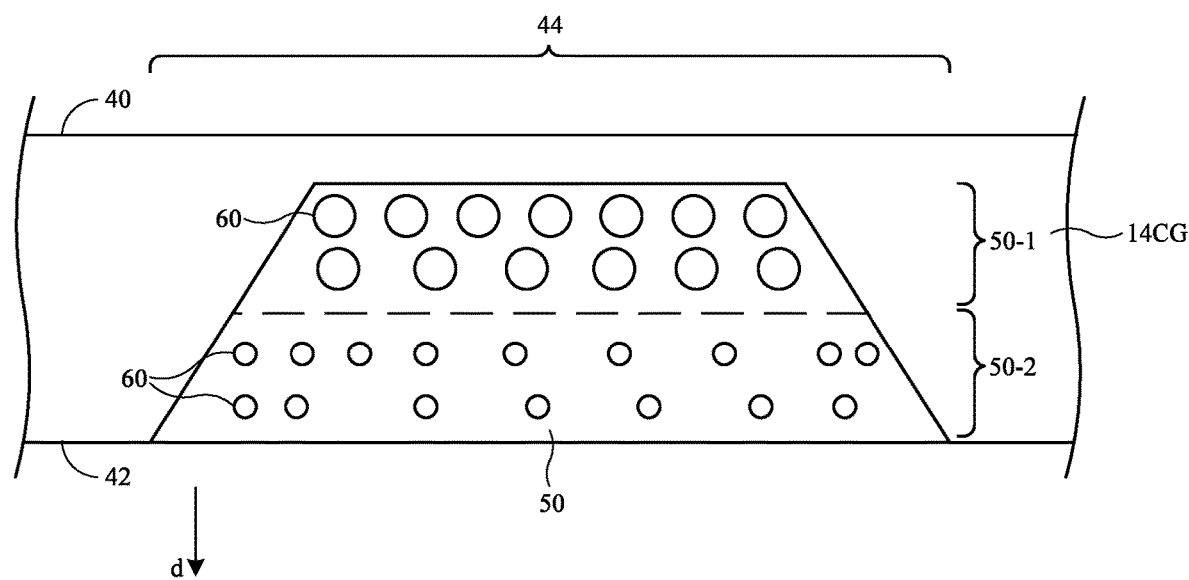
FIG. 9 is a cross-sectional side view of an illustrative display cover layer with a locally thinned portion in accordance with an embodiment.

As described in connection with curve 66 of FIG. 8, characteristic M of particles 60 may exhibit stepwise variation as a function of distance d. This type of arrangement is shown in the cross-sectional side view of display cover layer 14CG of FIG. 9. In the example of FIG. 9, polymer 50 has been formed using a first layer of polymer 50-1 containing particles 60 of a first diameter followed by a second layer of polymer 50-2 (at greater distance d from surface 40) containing particles 60 of a second diameter that is smaller than the first diameter. In this example, polymer 50 was deposited in two layers (e.g., a first layer that was deposited as a liquid and cured and a second layer that was deposited as a liquid on the cured first layer and subsequently cured). Configurations with three or more discrete layers each having a different size of particle 60 may also be used.

Figure 10:
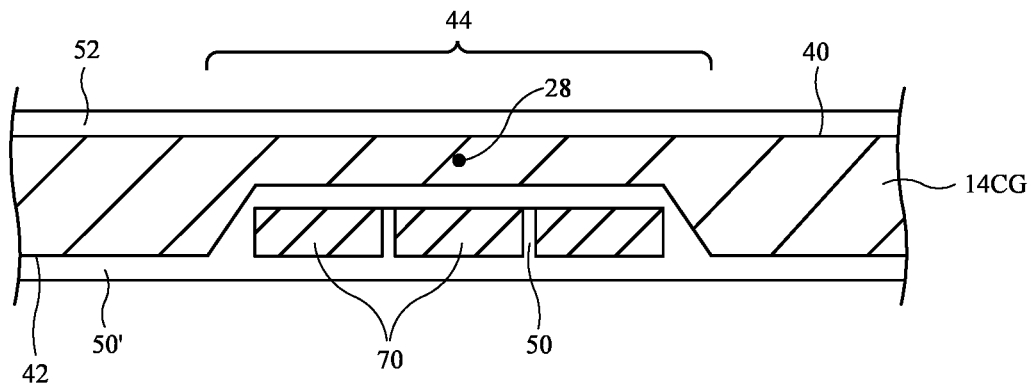
FIGS. 10 and 11 are cross-sectional side views of illustrative display cover layers with locally thinned areas having polymer with embedded stiffening members in accordance with embodiments.

If desired, elongated members formed from glass or other stiffening material may be incorporated into polymer 50 in locally thinned region 44. As shown in FIG. 10, for example, a series of parallel elongated members such as glass strips 70 or other members that extend parallel to bend axis 28 may serve as stiffening structures. Strips 70 may be incorporated into polymer 50 to help vertically stiffen surface 40 in locally thinned portion 44 of display cover layer 14CG (e.g., to help prevent surface 40 from being too easily deformed inwardly when the portion of surface 40 that overlaps thinned portion 44 is contacted by a computer stylus or other external object that presses inwardly on surface 40). Although strips 70 provide enhanced vertical rigidity to surface 40 over portion 44, the presence of strips 70 will not reduce the flexibility of display 14 with respect to bending about bend axis 28, because strips 70 are free to move with respect to each other and with respect to thinned portion 44 of display cover layer 14CG as display 14 is folded.

Polymer 50, which fills the recess of thinned portion 44 of display cover layer 14CG, may extend laterally to cover regions of inner surface 42 on non-thinned portions of display cover layer 14CG (see, e.g., portion 50', as described in connection with FIG. 6). If desired, a separate polymer protective coating may be formed on inner surface 42 (see, e.g., coating layer 54 of FIG. 5). As described in connection with layers 52 of FIG. 4, one or more optional layers may be provided on outer surface 40 such as layer 52 of FIG. 10. There may be any suitable number of parallel strips 70 in the recess of thinned portion 44. There are three strips 70 in the example of FIG. 10. There may be fewer than three strips 70 or more than three strips 70, if desired. Strips 70 may be formed from glass or other rigid transparent material (clear ceramic, sapphire or other crystalline material, etc.). Configurations in which strips 70 are glass strips and lie parallel to surfaces 40 and 42 when display 14 is in an unfolded planar state are sometimes described herein as an example. The presence of strips 70 helps ensure that surface 40 will not be too easily deformed inwardly when contacted by a stylus or other external object. The presence of elongated polymer-filled gaps between adjacent strips 70 (e.g., gaps that extend parallel to bend axis 28) helps to ensure that display 14 can exhibit sufficient flexibility to bend about axis 28 when device 10 is folded and unfolded.

Figure 11:
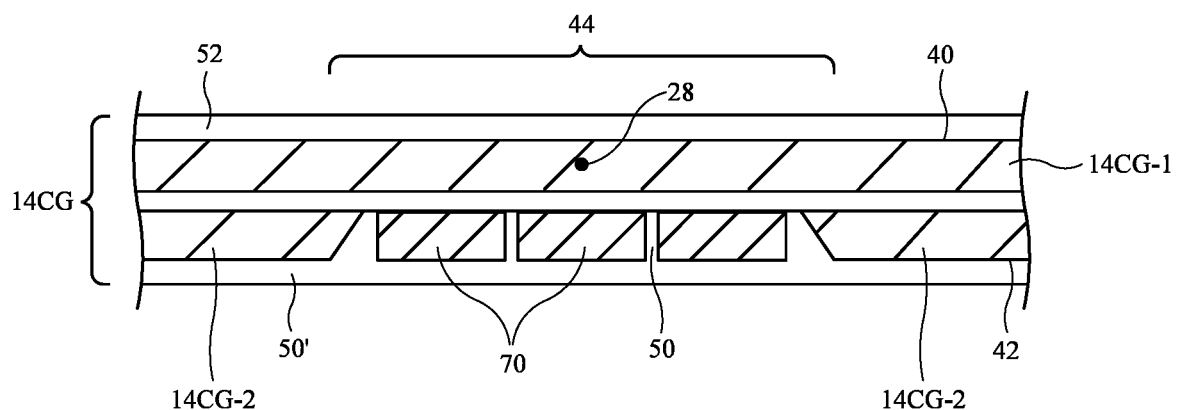

In the example of FIG. 11, a display cover layer similar to that of FIG. 10 has been constructed using a pair of laminated layers. In locally thinned portion 44, display cover layer 14CG exhibits enhanced local flexibility, because only a single thickness of display cover layer material (e.g., a single glass layer) is present (e.g., display cover layer 14CG-1 is present and display cover layer 14CG-2 is not present in portion 44). In portions 46, display cover layer 14CG includes both upper display cover layer 14CG-1 and lower display cover layer 14CG-2 (e.g., an additional glass layer). Lower display cover layer 14CG-2 is attached to upper display cover layer 14CG-1 by a layer of polymer such as polymer adhesive 72 (e.g., part of polymer 50 or a separate polymer layer). Polymer 50 may have portions 50' that extend to form a protective inner surface cover layer on surface 42 or a separate protective polymer layer may be formed on surface 42, as shown in FIG. 5. Layer 14CG-2 of FIG. 11 has two halves (e.g., left and right halves separated by a gap that forms a recess in display cover layer 14CG under thinned portion 44). The gap in layer 14CG-2 helps enhance the flexibility of layer 14CG so that layer 14CG can bend about bend axis 28. Strips 70 and/or other stiffening structures may be embedded in polymer 50 in the gap formed between the left and right halves of layer 14CG.

Figure 12:
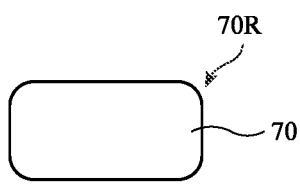
FIG. 12 is a cross-sectional side view of an illustrative stiffening member for adding compression rigidity to a locally thinned portion of a cover layer in accordance with an embodiment.

To help reduce cracks that might weaken strips 70, strips 70 may be etched in a glass etchant (e.g., HF) and/or mechanically polished. This process and/or other processing techniques may be used to form glass strips such as strip 70 of FIG. 12, which has a cross-sectional profile with a rectangular shape having rounded corners 70R. The presence of rounded corners 70R or other curved surface profiles may help prevent chips and other damage in the event that adjacent strips 70 contact each other and may help to remove cracks that could lead to fracturing.

The thickness of display cover layer 14CG in region 44 may be 30-200 microns, at least 10 microns, at least 20 microns, less than 500 microns, less than 300 microns, less than 200 microns, less than 100 microns, or other suitable thickness that is less than the thickness of display cover layer 14CG in non-thinned regions. The thickness of glass strips 70 (which may be the same as the thickness of layer 14CG-2 in the configuration of FIG. 11) may be 30-200 microns, at least 10 microns, at least 20 microns, less than 500 microns, less than 300 microns, less than 200 microns, less than 100 microns, or other suitable thickness. The thickness of display cover layer 14CG in regions 46 may be 30-600 microns, 100-600 microns, 100-400 microns, at least 30 microns, at least 100 microns, at least 200 microns, less than 3000 microns, less than 1000 microns, less than 600 microns, less than 400 microns, or other suitable thickness.

Strips 70 may each have the same width or the widths of strips 70 may differ from each other. The width of each of strips 70 may be at least 10 microns, at least 100 microns, at least 500 microns, at least 1.5 mm, at least 3 mm, at least 6 mm, 1-10 mm, 1-3 mm, 0.5-2 mm, less than 10 mm, less than 7 mm, less than 4 mm, less than 2.5 mm, less than 1.5 mm, or other suitable width. The length of each strip 70 may span the entire width of device 10 (e.g., each strip 70 may have a length equal to the distance that bend axis 28 traverses across device 10 and display 14) or each of strips 70 may be divided into two or more segments along its length (e.g., a strip may have two halves or more segments arranged end-to-end that collectively span the width of display 14). Strips 70 may be formed from the same material (e.g., the same glass) as display cover layer 14CG or may be formed from a material with an identical or similar refractive index. This may help match the refractive index values of strips 70 to the refractive index of display cover layer 14CG (e.g., so that index of strips 70 differs from the index of layer 14CG and from the index of polymer 50 by less than 0.15, by less than 0.1, or by less than 0.05, as examples).

To help enhance the rigidity of surface 40 over thinned portion 44, polymer 50 of FIGS. 10 and 11 may include glass beads or other stiffening particles in addition to stiffening structures such as strips 70 (e.g., the polymer-filled groove under portion 44 may contain both stiffening structures such as glass beads and stiffening structures such as glass strips). The stiffening particles may be particles such as particles 60 of FIG. 7. Such particles may have a single diameter or may have varying diameters (e.g., diameters that vary as shown by curves 64 and 66 of FIG. 8 or that otherwise decrease as a function of increasing distance into polymer 50 away from outer surface 40). If desired, index-matching nanoparticles 62 may also be incorporated into polymer 50 to help match the refractive index of polymer 50 to that of strips 70 and display cover layer 14CG (e.g., thinned portion 44).

Polymer 50 may be stiffened and/or index-matched to display cover layer 14CG using an inhomogeneous mixture of embedded particles (particles of different sizes, shapes, and/or materials) or a homogenous mixture of embedded particles. Embedded particles (e.g., particles 60 and/or 62 and/or other particles in polymer 50) may be formed from materials having a refractive index that differs from that of polymer 50 (e.g., particles for index matching polymer 50 to cover layer 14CG and optionally stiffening polymer 50) and/or from materials having a matched refractive index (e.g., particles used for stiffening polymer 50 but not used to change the refractive index of polymer 50). The embedded particles may be nanoparticles and/or larger particles having fixed characteristics throughout polymer 50 and/or having one or more characteristics that vary as a function of distance through the thickness of polymer 50.

The embedded particles may, for example, have a mean size or other attribute (e.g., composition, shape, etc.) that varies as a function of position within polymer 50 (e.g., as a function of distance d) in a smooth and continuous (non-stepwise) fashion and/or in a stepwise fashion). Embedded particles may be formed from glass beads, other glass particles, and/or other dielectric (e.g., beads or other particles formed from silica, metal oxides such as zirconia particles, alumina particles, titania particles, etc.). The embedded particles may be spherical, plate-shaped (e.g., flakes), rod-shaped, and/or may have other suitable shapes.

In an illustrative configuration, the embedded particles are particles characterized by a mean diameter. The mean diameter of the particles may be 0.01 microns to 50 microns, 0.05 microns to 25 microns, 0.01 microns to 25 microns, 0.03 microns to 50 microns, at least 0.01 microns, at least 0.1 microns, at least 1 micron, less than 50 microns, less than 5 microns, less than 0.5 microns, etc. The mean diameter may be fixed throughout a homogenous mixture in polymer 50 and/or may have a value within these ranges or other suitable ranges that varies as a function of position within polymer 50 (e.g., as a function of distance d), etc. As an example, embedded dielectric particles in polymer 50 may be characterized by a mean diameter of 0.01 microns to 50 microns (or other suitable range) that is fixed through polymer 50 or that varies as a function of distance (e.g., distance d) through polymer 50 while serving to enhance resistance of the outer surface of display cover layer 14CG over the locally thinned portion of the display cover layer to inward deformation and while allowing the display cover layer to bend about bend axis 28.

As described above, one aspect of the present technology is the gathering and use of information such as information from input-output devices. The present disclosure contemplates that in some instances, data may be gathered that includes personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, username, password, biometric information, or any other identifying or personal information.

The present disclosure recognizes that the use of such personal information, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the United States, collection of or access to certain health data may be governed by federal and/or state laws, such as the Health Insurance Portability and Accountability Act (HIPAA), whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, the present technology can be configured to allow users to select to "opt in" or "opt out" of participation in the collection of personal information data during registration for services or anytime thereafter. In another example, users can select not to provide certain types of user data. In yet another example, users can select to limit the length of time user-specific data is maintained. In addition to providing "opt in" and "opt out" options, the present disclosure contemplates providing notifications relating to the access or use of personal information. For instance, a user may be notified upon downloading an application ("app") that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data at a city level rather than at an address level), controlling how data is stored (e.g., aggregating data across users), and/or other methods.

Therefore, although the present disclosure broadly covers use of information that may include personal information data to implement one or more various disclosed embodiments, the present disclosure also contemplates that the various embodiments can also be implemented without the need for accessing personal information data. That is, the various embodiments of the present technology are not rendered inoperable due to the lack of all or a portion of such personal information data.

The foregoing is merely illustrative and various modifications can be made to the described embodiments. The foregoing embodiments may be implemented individually or in any combination.

What is claimed is:

1. An electronic device, comprising:
   a foldable housing that is configured to bend about a bend axis;
   a flexible display panel that overlaps the bend axis; and
   a display cover layer that overlaps the flexible display panel, wherein the display cover layer has an inner surface that faces the flexible display panel and has an opposing outer surface and wherein the display cover layer has a groove extending along the bend axis that forms a locally thinned portion of the display cover layer;
   polymer in the groove; and
   stiffening structures comprising particles embedded in the polymer that enhance resistance of the outer surface over the locally thinned portion to inward deformation while allowing the display cover layer to bend about the bend axis.

2. The electronic device defined in claim 1 wherein the particles have a mean diameter that varies as a function of distance through the polymer.

3. The electronic device defined in claim 2 wherein the particles have a first mean diameter at a first distance into the polymer from the outer surface and wherein the particles have a second mean diameter that is smaller than the first mean diameter at a second distance into the polymer from the outer surface that is larger than the first distance.

4. The electronic device defined in claim 3 wherein the mean diameter of the particles varies smoothly and continuously as the function of distance through the polymer.

5. The electronic device defined in claim 3 wherein the mean diameter of the particles is characterized by a stepwise change as the function of distance through the polymer.

6. The electronic device defined in claim 2 wherein the mean diameter is 0.5 microns to 50 microns.

7. The electronic device defined in claim 6 wherein the particles comprise glass particles.

8. The electronic device defined in claim 1 wherein the particles comprise glass beads.

9. The electronic device defined in claim 8 wherein the glass beads have diameters of 1-50 microns and wherein the polymer contains inorganic nanoparticles of less than 250 nm in diameter.

10. The electronic device defined in claim 1 wherein the stiffening structures further comprise glass strips.

11. The electronic device defined in claim 10 wherein the glass strips have rectangular cross-sectional profiles with rounded corners.

12. The electronic device defined in claim 1 wherein the particles comprise glass beads and the stiffening structures further comprise glass strips.

13. The electronic device defined in claim 12 wherein the polymer contains nanoparticles with diameters of less than 300 nm at a concentration, wherein the polymer has a first refractive index, wherein the display cover layer has a second refractive index, and wherein the concentration is configured to ensure that the first refractive index and the second refractive index differ by less than 0.05.

14. The electronic device defined in claim 1 wherein the display cover layer comprises a glass layer and has a non-thinned portion, the electronic device further comprising a polymer coating on the inner surface of the non-thinned portion.

15. The electronic device defined in claim 14 wherein the polymer coating is an extended portion of the polymer in the groove.

16. The electronic device defined in claim 14 wherein the polymer coating and the polymer in the groove are different polymer materials.

17. An electronic device, comprising:
a foldable housing that is configured to bend about a bend axis;
a flexible display panel that overlaps the bend axis;
a glass display cover layer that overlaps the flexible display panel, wherein the glass display cover layer has an outer surface and has an inner surface facing the flexible display panel and wherein the glass display cover layer has a recess in the inner surface that extends along the bend axis and forms a locally thinned portion of the glass display cover layer; and
polymer in the recess that contains glass strips that stiffen the outer surface over the recess while allowing the glass display cover layer to bend about the bend axis, wherein the polymer is interposed between the glass strips and the glass display cover layer.

18. The electronic device defined in claim 17 further comprising glass beads in the polymer.

19. A foldable display, comprising:
a foldable display panel configured to fold about a bend axis; and
a display cover layer that overlaps the foldable display panel, wherein the display cover layer has a recess forming a locally thinned portion of the display cover layer that extends along the bend axis, the display cover layer comprising:
a first layer of glass that overlaps the foldable display panel;
a second layer of glass attached to an inner surface of the first layer of glass by a polymer layer, wherein the second layer of glass has first and second halves separated by a gap that forms the recess; and
polymer containing glass stiffening structures in the recess, wherein the polymer is interposed between the glass stiffening structures and the display cover layer.

20. The foldable display defined in claim 19 wherein the glass stiffening structures comprise glass beads.

21. The foldable display defined in claim 20 wherein at least one characteristic of the glass beads varies as a function of distance through the polymer.

22. The foldable display defined in claim 19 wherein the glass stiffening structures comprise glass strips that extend parallel to the bend axis.

23. The foldable display defined in claim 22 wherein the glass stiffening structures further comprise glass beads, the foldable display further comprising:
nanoparticles in the polymer having diameters less than 200 nm;
a polymer coating on a surface of the second layer of glass facing the foldable display panel; and
an antireflection coating on an outer surface of the first layer of glass facing away from the foldable display panel.

24. An electronic device, comprising:
a foldable housing that is configured to bend about a bend axis;
a flexible display panel that overlaps the bend axis;
a display cover layer that overlaps the flexible display panel, wherein the display cover layer has an inner surface that faces the flexible display panel and has an opposing outer surface and wherein the display cover layer has a groove extending along the bend axis that forms a locally thinned portion of the display cover layer;
polymer in the groove; and
dielectric particles embedded in the polymer that enhance resistance of the outer surface over the locally thinned portion to inward deformation while allowing the display cover layer to bend about the bend axis, wherein the dielectric particles have a mean diameter between 0.01 microns and 50 microns and wherein the mean diameter varies as a function of distance through the polymer.

* * * * *